(12) United States Patent
Derner et al.

(10) Patent No.: US 10,957,382 B2
(45) Date of Patent: Mar. 23, 2021

(54) INTEGRATED ASSEMBLIES COMPRISING VERTICALLY-STACKED MEMORY ARRAY DECKS AND FOLDED DIGIT LINE CONNECTIONS

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/408,095

(22) Filed: May 9, 2019

(65) Prior Publication Data

US 2020/0051614 A1 Feb. 13, 2020

Related U.S. Application Data

(60) Provisional application No. 62/716,480, filed on Aug. 9, 2018.

(51) Int. Cl.
*G11C 11/40* (2006.01)
*G11C 11/4091* (2006.01)
*G11C 11/408* (2006.01)

(52) U.S. Cl.
CPC ...... *G11C 11/4091* (2013.01); *G11C 11/4085* (2013.01)

(58) Field of Classification Search
CPC ............ G11C 11/4091; G11C 11/4085; G11C 11/4097; G11C 5/025
See application file for complete search history.

(56) References Cited

U.S. PATENT DOCUMENTS

| | | | | | |
|---|---|---|---|---|---|
| 5,933,380 | A | * | 8/1999 | Tsuchida | G11C 7/18 365/207 |
| 6,188,599 | B1 | * | 2/2001 | Kang | G11C 11/22 365/65 |
| 6,522,594 | B1 | * | 2/2003 | Scheuerlein | G11C 7/062 365/105 |
| 2008/0291762 | A1 | * | 11/2008 | Kajigaya | G11C 11/4076 365/203 |
| 2012/0268978 | A1 | * | 10/2012 | Shibata | H01L 27/11524 365/63 |
| 2013/0070506 | A1 | * | 3/2013 | Kajigaya | H01L 27/2436 365/51 |
| 2013/0223140 | A1 | * | 8/2013 | Sohn | G11C 7/1006 365/158 |
| 2016/0293228 | A1 | * | 10/2016 | Won | G11C 7/065 |
| 2017/0236586 | A1 | * | 8/2017 | Maejima | H01L 27/11573 365/185.05 |

* cited by examiner

*Primary Examiner* — Mohammed A Bashar
(74) *Attorney, Agent, or Firm* — Wells St. John P.S.

(57) ABSTRACT

Some embodiments include an integrated assembly having a base with sense-amplifier-circuitry. A first deck is over the base, and includes a first array of first memory cells. A second deck over the first deck, and includes a second array of second memory cells. A first digit line is associated with the first array, and a second digit line is associated with the second array. The first and second digit lines are comparatively coupled with one another through the sense-amplifier-circuitry.

14 Claims, 9 Drawing Sheets

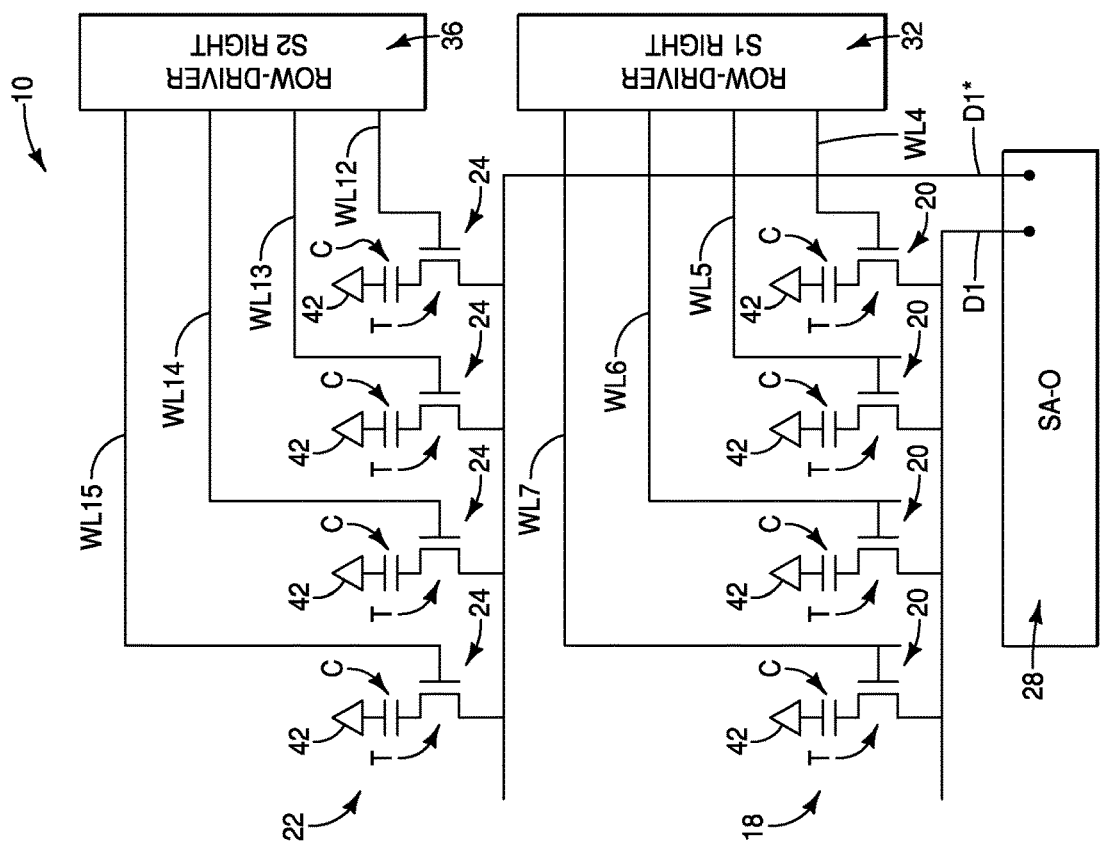
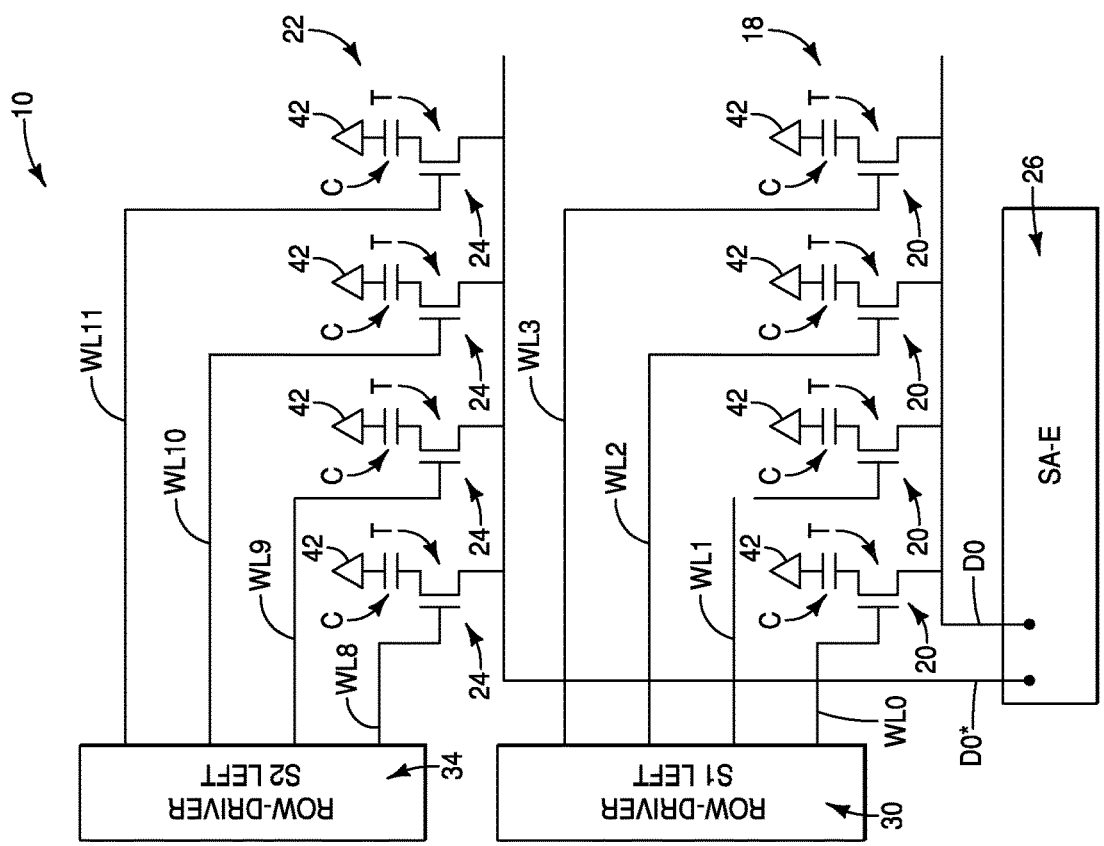
FIG. 7B
FIG. 7A

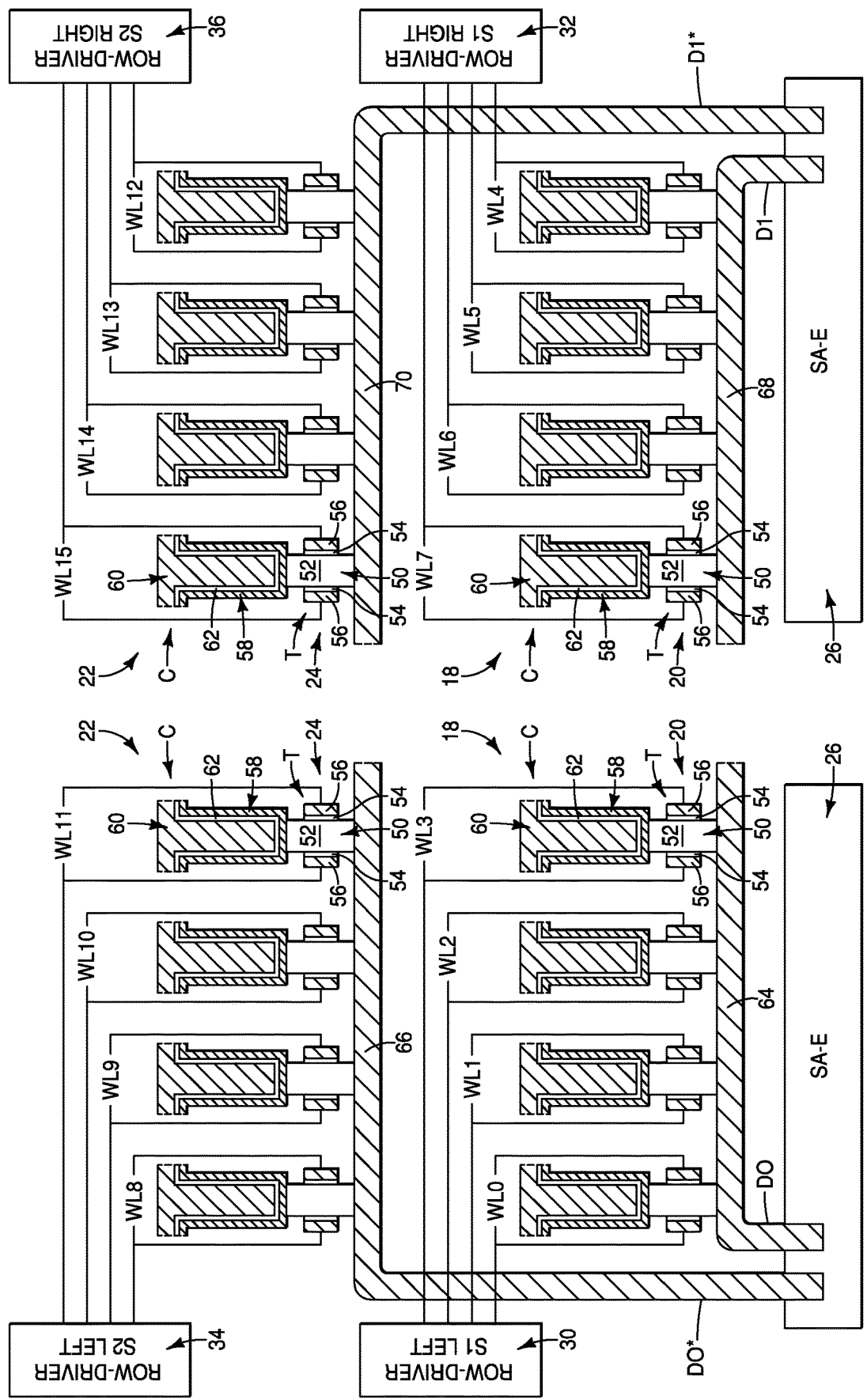

US 10,957,382 B2

INTEGRATED ASSEMBLIES COMPRISING VERTICALLY-STACKED MEMORY ARRAY DECKS AND FOLDED DIGIT LINE CONNECTIONS

RELATED PATENT DATA

This patent is related to U.S. Provisional Application Ser. No. 62/716,480, which was filed Aug. 9, 2018.

TECHNICAL FIELD

Integrated assemblies comprising vertically-stacked memory array decks and folded digit line connections.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells each having one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

A continuing goal of integrated circuit fabrication is to increase packing density and to thereby increase the level of integration. It would be desirable to develop three-dimensional arrangements having tightly packed memory.

BRIEF DESCRIPTION OF THE DRAWINGS

FIGS. 7A and 7B are diagrammatic side views along the lines A-A and B-B, respectively, of FIG. 4 showing example arrangements of circuit components.

FIGS. 8A and 8B are diagrammatic side views along the lines A-A and B-B, respectively, of FIG. 4 showing example arrangements of circuit components.

DETAILED DESCRIPTION OF THE ILLUSTRATED EMBODIMENTS

Some embodiments include integrated assemblies in which a first memory array is vertically offset relative to a second memory array, and in which sense-amplifier-circuitry is provided under the first and second memory arrays. First digit lines are associated with the first memory array, and second digit lines are associated with the second memory array. The first digit lines are comparatively coupled with the second digit lines through the sense-amplifier-circuitry. The first and second digit lines extend laterally (i.e., horizontally) along the memory arrays, and then fold at edges of the memory arrays to extend vertically to the sense-amplifier-circuitry. Accordingly, some embodiments may be considered to comprise folded digit line connections. Example embodiments are described with reference to FIGS. 4, 4A, 4B, 5, 6A, 6B, 7A, 7B, 8A, 8B and 9.

Figure 4:
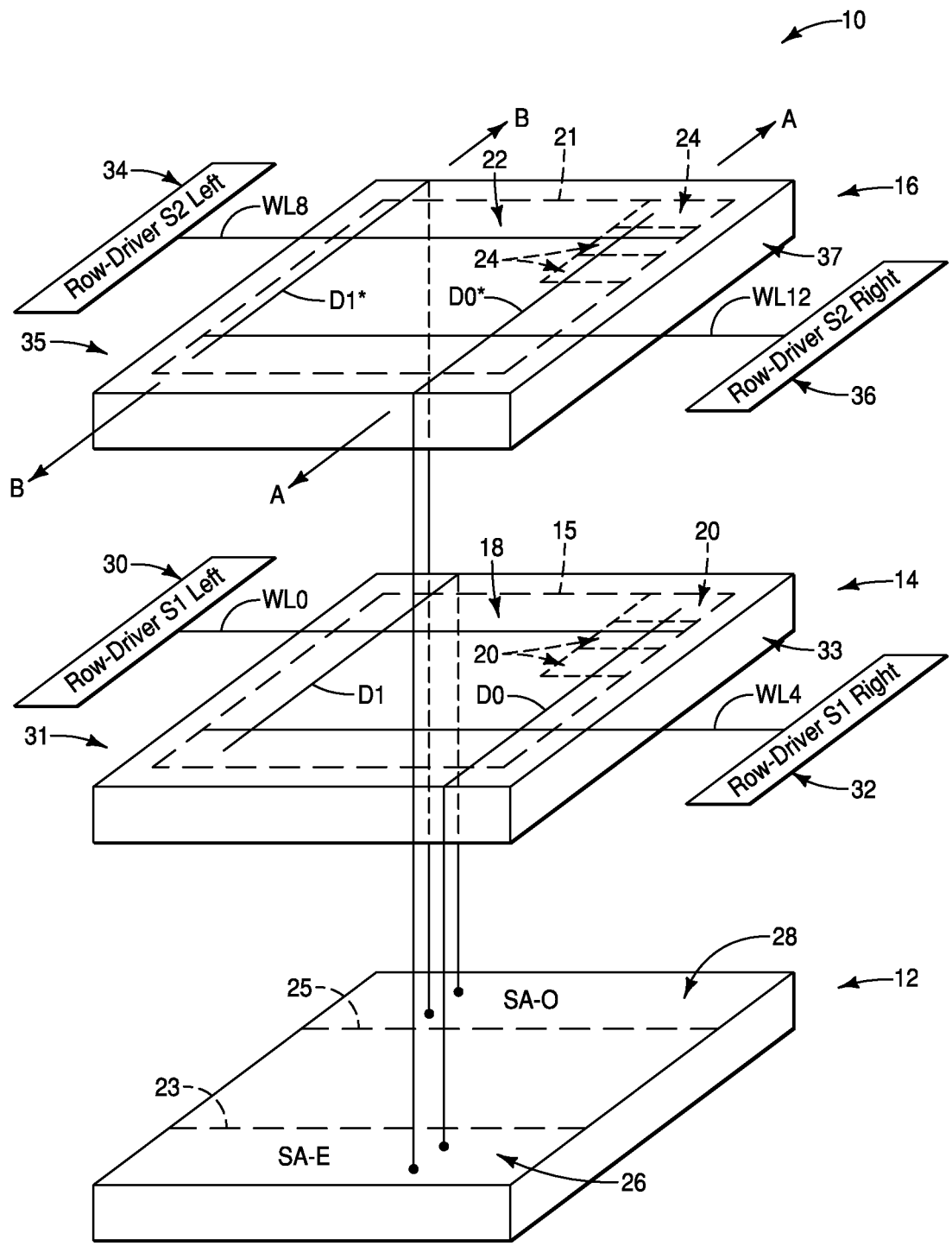
FIG. 4 is a schematic diagram of an example integrated assembly having multiple decks which are vertically displaced relative to one another.

Referring to FIG. 4, an integrated assembly 10 includes a base 12, a first deck 14 over the base, and a second deck 16 over the first deck.

Figure 1:
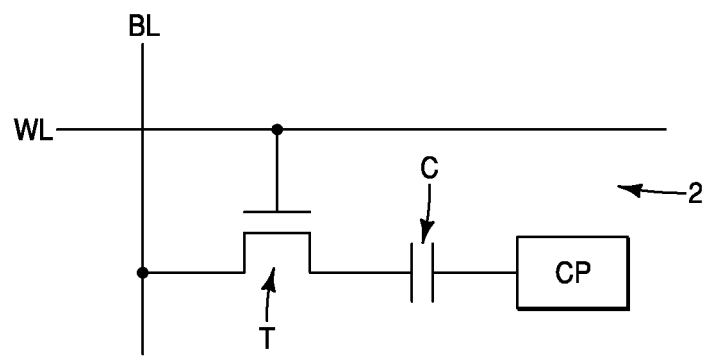
FIG. 1 is a schematic diagram of a prior art memory cell having 1 transistor and 1 capacitor.
Figure 2:
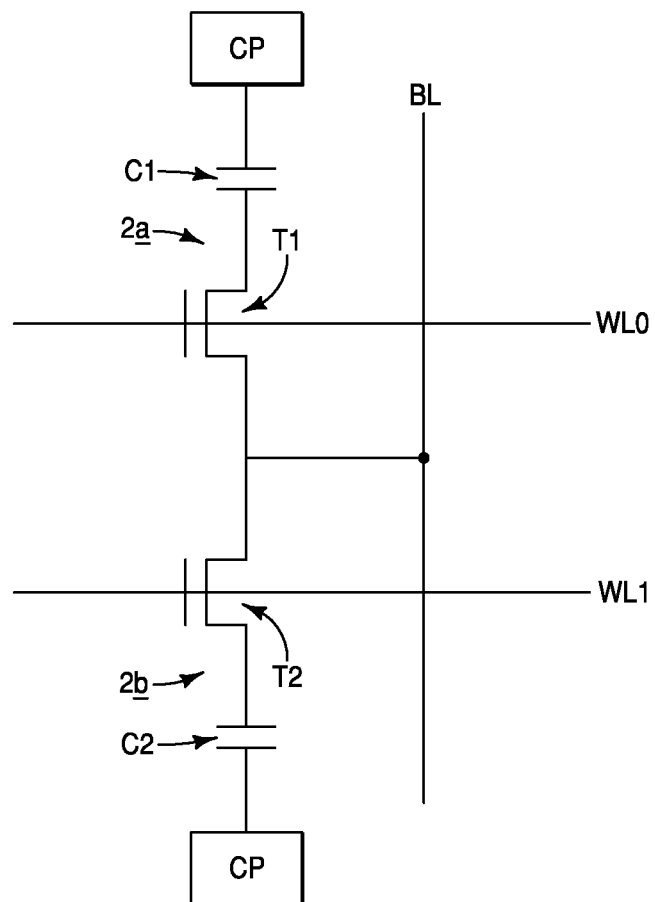
FIG. 2 is a schematic diagram of a pair of prior art memory cells which each have 1 transistor and 1 capacitor, and which share a bitline connection.
Figure 3:
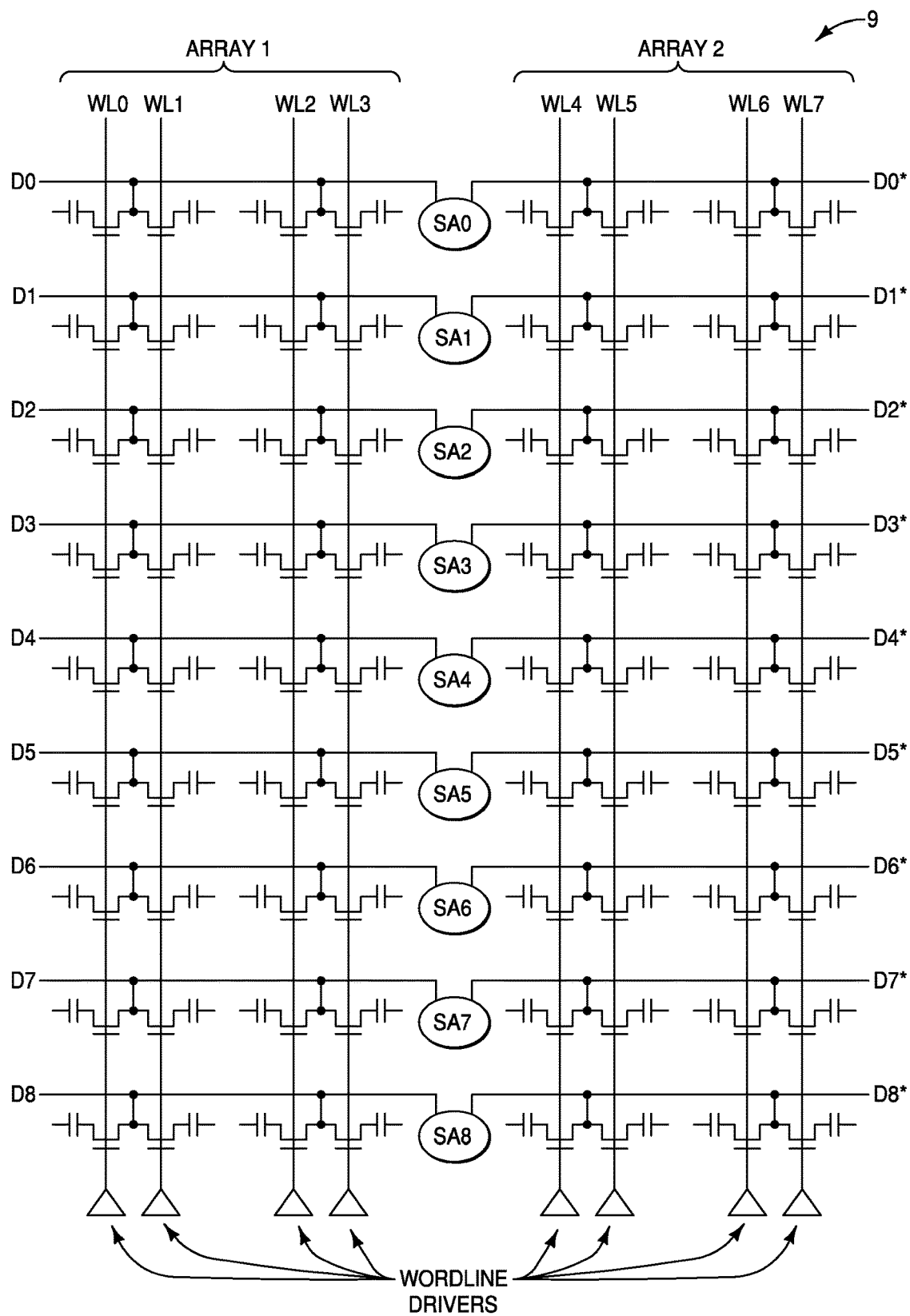
FIG. 3 is a schematic diagram of a prior art integrated assembly having open bitline architecture.

The first deck 14 includes a first memory array 18, with an approximate outer periphery of such memory array being diagrammatically illustrated utilizing a dashed line 15. The first memory array includes first memory cells 20 which are diagrammatically illustrated as boxes within the memory array. Only some of the first memory cells are shown, but in practice the first memory cells may extend entirely across the first memory array. The first memory array 18 may comprise any suitable number of first memory cells, and in some embodiments may comprise hundreds, thousands, millions, etc., of first memory cells. The first memory cells may be DRAM cells, and in some embodiments may be configured in arrangements of the types described above with reference to prior art FIGS. 1-3.

The second deck 16 includes a second memory array 22, with an approximate outer periphery of such memory array being diagrammatically illustrated utilizing a dashed line 21. The second memory array includes second memory cells 24 which are diagrammatically illustrated as boxes within the memory array. Only some of the second memory cells are shown, but in practice the second memory cells may extend entirely across the second memory array. The second memory array 22 may comprise any suitable number of memory cells, and in some embodiments may comprise hundreds, thousands, millions, etc., of second memory cells. The second memory cells may be DRAM cells, and in some embodiments may be configured in arrangements of the types described above with reference to prior art FIGS. 1-3.

In some embodiments, the first and second decks may be referred to as first and second memory decks, respectively.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc. Each of the decks 14 and 16 may also comprise semiconductor material.

In the shown embodiment, the base 12 comprises sense-amplifier-circuitry. Specifically, the base comprises first sense-amplifier-circuitry 26 and second sense-amplifier-circuitry 28, with the second sense-amplifier circuitry being laterally displaced relative to the first sense-amplifier-circuitry. Dashed lines 23 and 25 are provided to illustrate approximate boundaries of the first and second sense-amplifier-circuitries 26 and 28, respectively. Although the first and second sense-amplifier-circuitries are shown to be laterally spaced from one another, in other embodiments the first and second sense-amplifier-circuitries may directly abut one another, or may even be intertwined with one another.

The first sense-amplifier-circuitry 26 is labeled as "SA-E" to identify it as being associated with an "even" portion of a circuit, and the second sense-amplifier-circuitry 28 is labeled as "SA-O" to identify it as being associated with an "odd" portion of a circuit. The terms "even" and "odd" are arbitrary, and are utilized to distinguish the two sense-amplifier-circuitries 26 and 28 from one another.

Figure 4A:
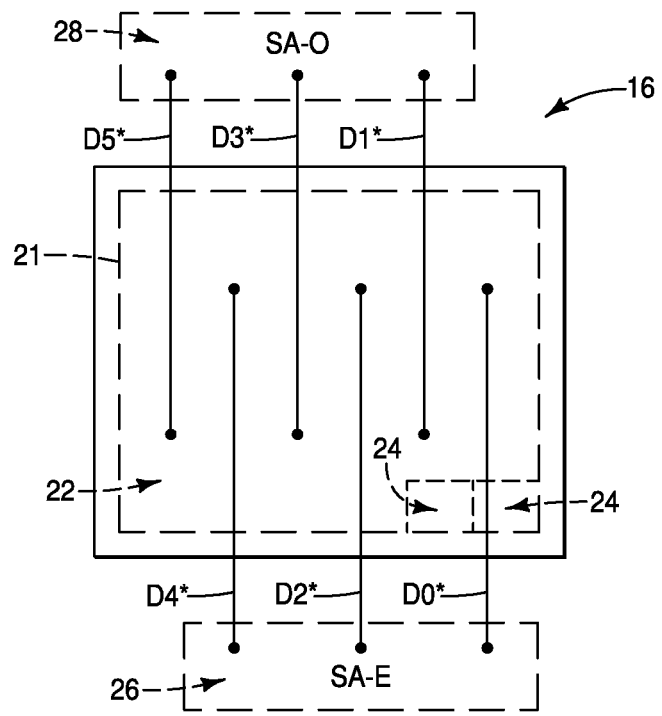
FIGS. 4A and 4B are top-down views of two of the decks of the FIG. 4 assembly.
Figure 4B:
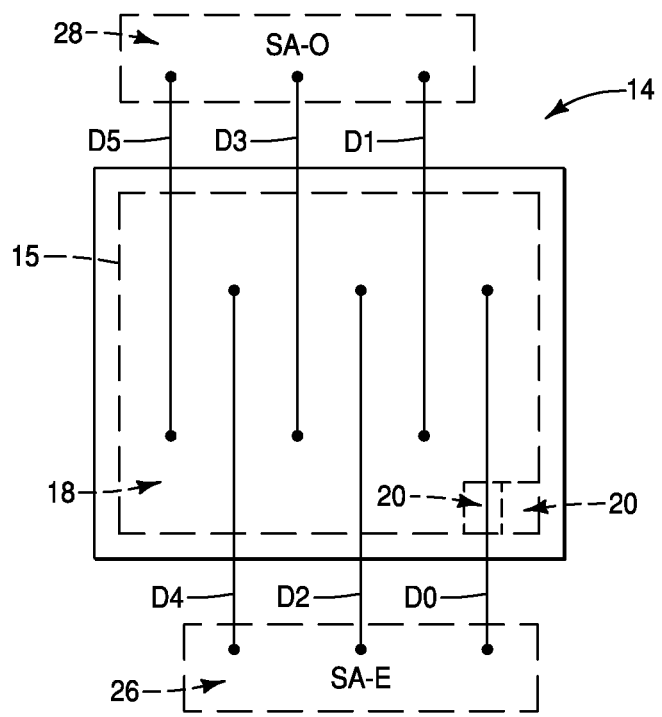

First digit lines D0 and D1 are associated with the first memory array 18. Specifically, the first digit lines D0 and D1 extend along the first memory array and are coupled with first memory cells 20 of the first memory array. The digit lines D0 and D1 are laterally spaced from one another, and may be representative of a large number of substantially identical digit lines extending across the first memory array; with the term "substantially identical" meaning identical to within reasonable tolerances of fabrication and measurement. The first digit lines may alternate between even first digit lines and odd first digit lines, with the digit line D0 being representative of an even first digit line, and the digit line D1 being representative of an odd first digit line. The even first digit lines (e.g., D0) are coupled with the first sense-amplifier-circuitry 26 (i.e., SA-E), and the odd first digit lines (e.g., D1) are coupled with the second sense-amplifier-circuitry 28 (i.e., SA-O). FIG. 4B shows a top-down view of the deck 14, and shows a plurality of even digit lines (D0, D2, D4) alternating with a plurality of odd digit lines (D1, D3, D5) across the memory array 18. The even digit lines are coupled with the first sense-amplifier-circuitry 26 (SA-E), and the odd digit lines are coupled with the second sense-amplifier-circuitry 28 (SA-O).

Second digit lines D0* and D1* are associated with the second memory array 22. Specifically, the second digit lines D0* and D1* extend along the second memory array and are coupled with second memory cells 24 of the second memory array. The digit lines D0* and D1* are laterally spaced from one another, and may be representative of a large number of substantially identical digit lines extending across the second memory array. The second digit lines may alternate between even second digit lines and odd second digit lines, with the digit line D0* being representative of an even second digit line, and the digit line D1* being representative of an odd second digit line. The even second digit lines (e.g., D0*) are coupled with the first sense-amplifier-circuitry 26 (i.e., SA-E), and the odd second digit lines (e.g., D1*) are coupled with the second sense-amplifier-circuitry 28 (i.e., SA-O). FIG. 4A shows a top-down view of the deck 16, and shows a plurality of even digit lines (D0*, D2*, D4*) alternating with a plurality of odd digit lines (D1*, D3*, D5*) across the memory array 22. The even digit lines are coupled with the first sense-amplifier-circuitry 26 (SA-E), and the odd digit lines are coupled with the second sense-amplifier-circuitry 28 (SA-O).

Figure 9:
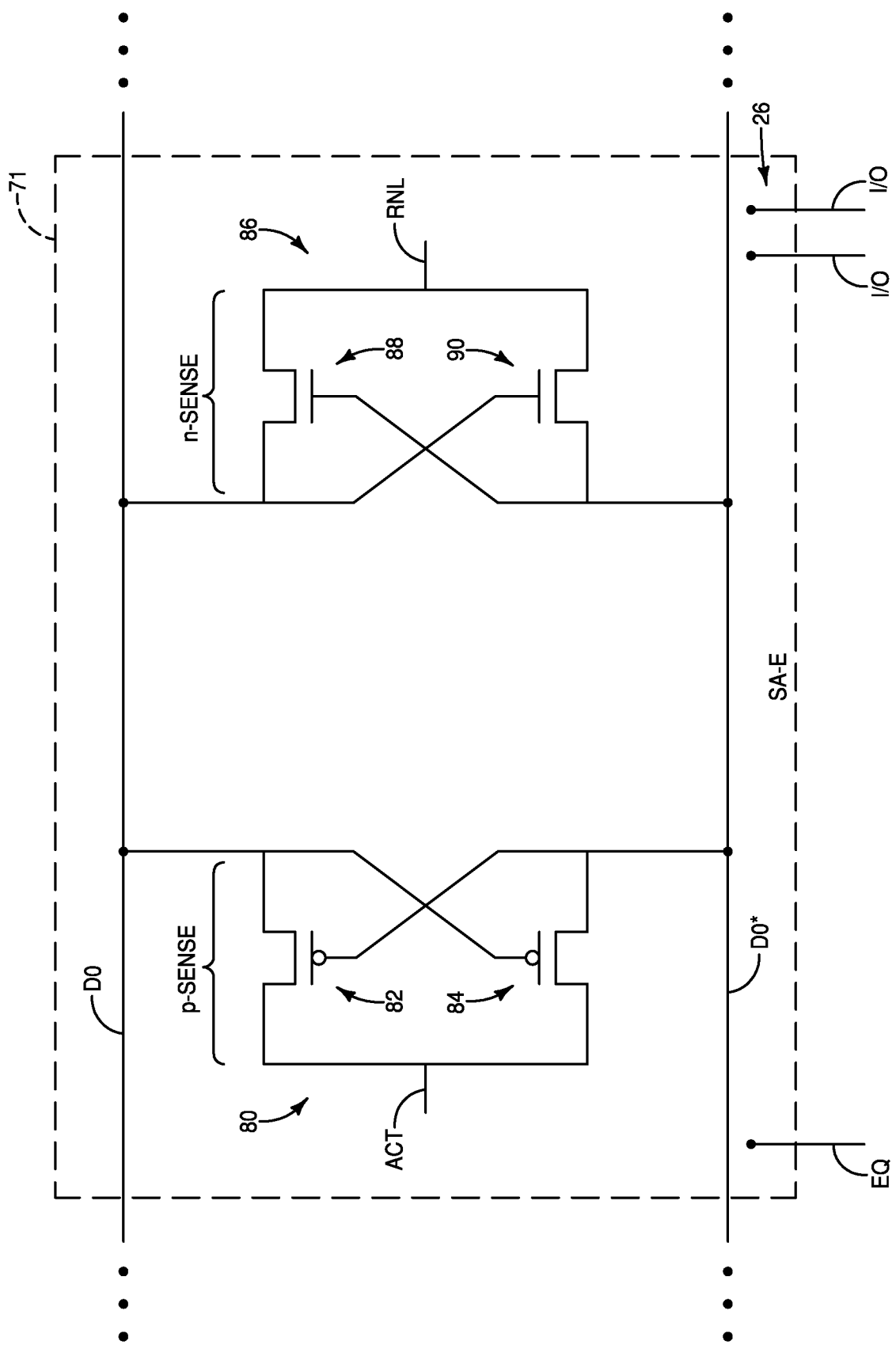
FIG. 9 is a diagrammatic schematic diagram of example sense-amplifier-circuitry.

The even first digit line D0 is comparatively coupled with the even second digit line D0* through the first sense-amplifier-circuitry 26, and the odd first digit line D1 is comparatively coupled with the odd second digit line D1* through the second sense-amplifier-circuitry 28. For purposes of understanding this disclosure and the claims that follow, a first digit line is "comparatively coupled" with a second digit line through a sense-amplifier-circuitry if the sense-amplifier-circuitry is configured to compare electrical properties (e.g., voltage) of the first and second digit lines with one another. FIG. 9 (discussed below) shows example sense-amplifier-circuitry 26, and shows an example application in which digit lines D0 and D0* are comparatively coupled through the example sense-amplifier-circuitry.

Each of the first digit lines (e.g., D0-D5 of FIG. 4B) is paired with one of the second digit lines (e.g., D0*-D5* of FIG. 4A) and comparatively coupled with the paired second digit line through one of the sense-amplifier-circuitries 26 and 28. In the illustrated application of FIGS. 4A and 4B, the digit line pairs would be D0/D0*, D1/D1*, D2/D2*, D3/D3*, D4/D4* and D5/D5*. The odd digit line pairs (D1/D1*, D3/D3* and D5/D5*) are comparatively coupled through the sense-amplifier-circuitry 28 (SA-O), and the even digit line pairs (D0/D0*, D2/D2*, and D4/D4*) are comparatively coupled through the sense-amplifier-circuitry 26 (SA-E).

In some embodiments, the first digit lines (e.g., D0 and D1 of FIG. 4) may be considered to be vertically displaced relative to the first and second sense-amplifier-circuitries 26 and 28; and the second digit lines (e.g., D0* and D1* of FIG. 4) may be considered to be vertically displaced relative to the first digit lines, and relative to the first and second sense-amplifier-circuitries 26 and 28.

FIG. 4 shows row-driver-circuitry along the decks 14 and 16. The first deck 14 is shown to have a first side (i.e., left side) 31 and an opposing second side (i.e., right side) 33; and to have a first row-driver 30 along the left side, and a second row-driver 32 along the right side. The first row-driver 30 is labeled as a "Row-Driver S1 Left", where S1 refers to stack one, and is referencing the first deck 14. The second row-driver 32 is labeled as "Row-Driver S1 Right". The second deck 16 is shown to have a first side (i.e., left side) 35, and an opposing second side (i.e., right side) 37; and to have a third row-driver 34 along the left side, and a fourth row-driver 36 along the right side. The third row-driver 34 is labeled as "Row-Driver S2 Left", where S2 refers to stack two, and is referencing the second deck 16. The fourth row-driver 36 is labeled as "Row-Driver S2 Right".

The first and second row-drivers 30 and 32 may be considered together as first wordline-driver-circuitry, and the second and third row-drivers 34 and 36 may be considered together as second wordline-driver-circuitry. In the illustrated embodiment, the first and second wordline-driver-circuitries are physically separated from one another, and are vertically displaced relative to one another. Specifically, the first deck 14 is shown at a first elevational level, and the row-drivers 30 and 32 of the first wordline-driver-circuitry are illustrated to be along such first elevational level; and the second deck 16 is shown to be at a second elevational level above the first elevational level, and the row-drivers 34 and 36 of the second wordline-driver circuitry are shown to be at the second elevational level. The utilization of separate wordline-driver-circuitry for the first and second decks can advantageously avoid one or more multiplexers which would otherwise be required to channel data if common wordline-driver-circuitry were to be utilized for both of the first and second decks.

The row-drivers 30, 32, 34 and 36 may be placed in any suitable locations, and in some embodiments may all be at a common elevational level as one another. For instance, all of the row-drivers 30, 32, 34 and 36 may be located beneath the deck 14, and may be provided over the sense-amplifiers of deck 12. In such embodiments, an additional deck may be provided between the decks 12 and 14, with at least one purpose of such additional deck being to support the row-drivers 30, 32, 34 and 36.

A first set of wordlines extends along the first memory array 18 of the first deck 14. Representative wordlines of such first set are labeled as WL0 and WL4 in FIG. 4. The wordline WL0 is coupled with the first row-driver 30, and the wordline WL4 is coupled with the second row-driver 32. A second set of wordlines extends along the second memory array 22 of the second deck 16. Representative wordlines of such second set are labeled as WL8 and WL12 in FIG. 4. The wordline WL8 is coupled with the third row-driver 34 and the wordline WL12 is coupled with the fourth row-driver 36.

The row-drivers 30 and 32 may be considered to be associated only with the wordlines of the first deck (e.g., WL0 and WL4), in that they are specifically utilized for driving the wordlines of the first deck and not for driving wordlines of another deck. Similarly, the row-drivers 34 and 36 may be considered to be associated only with the wordlines of the second deck (e.g., WL8 and WL12), in that they are specifically utilized for driving the wordlines of the second deck and not for driving wordlines of another deck.

Each of the first memory cells 20 within the first memory array 18 is uniquely addressed by one of the digit lines extending along the memory array 18 (e.g., one of the digit lines D0 and D1 of FIG. 4), and one of the wordlines extending along the memory array 18 (e.g., one of the wordlines WL0 and WL4 of FIG. 4). Similarly, each of the memory cells 24 within the second memory array 22 is uniquely addressed by one of the digit lines extending along the memory array 22 (e.g., one of the digit lines D0* and D1* of FIG. 4), and one of the wordlines extending along the memory array 22 (e.g., one of the wordlines WL8 and WL12 of FIG. 4). In some embodiments, the digit lines along the first memory array 18 may be referred to as a first set of digit lines, while the digit lines along the second memory 22 are referred to as a second set of digit lines; and similarly the wordlines along the first memory array 18 may be referred to as a first set of wordlines, while the wordlines along the second memory 22 are referred to as a second set of wordlines. Accordingly, each of the memory cells 20 of the memory array 18 may be considered to be uniquely addressed utilizing a wordline from the first set of wordlines in combination with a digit line from the first set of digit lines; and each of the memory cells 24 of the memory array 22 may be considered to be uniquely addressed utilizing a wordline from the second set of wordlines in combination with a digit line from the second set of digit lines.

In some embodiments, the row-drivers 30 and 32 may be considered to be first and second components, respectively, of the first wordline-driver-circuitry. The wordlines along the memory array 18 of the first deck 14 may be considered to be first wordlines of a first set of wordlines, with such first wordlines alternating between even and odd first wordlines. The even first wordlines are coupled with the first component of the first wordline-driver-circuitry (i.e., the first row-driver 30); with the wordline WL0 being representative of the even first wordlines. The odd first wordlines are coupled with the second component of the first wordline-driver-circuitry (i.e., the row-driver 32); with the wordline WL4 being representative of the odd first wordlines. The terms "even" and "odd" are arbitrary as applied to the first wordlines, and are utilized distinguish the wordlines coupled with the first row-driver 30 from those coupled with the second row-driver 32.

In some embodiments, the row-drivers 34 and 36 may be considered to be third and fourth components, respectively, of the second wordline-driver-circuitry (with the terms "third component" and "fourth component" being utilized to distinguish these components from the first and second components described above). The wordlines along the memory array 22 of the second deck 16 may be considered to be second wordlines of a second set of wordlines, with such second wordlines alternating between even and odd second wordlines. The even second wordlines are coupled with the third component of the second wordline-driver-circuitry (i.e., the third row-driver 34); with the wordline WL8 being representative of the even second wordlines. The odd second wordlines are coupled with the fourth component of the second wordline-driver-circuitry (i.e., the row-driver 36); with the wordline WL12 being representative of the odd second wordlines. The terms "even" and "odd" are arbitrary as applied to the second wordlines, and are utilized distinguish the wordlines coupled with the third row-driver 34 from those coupled with the fourth row-driver 36.

An advantage of the configuration of FIG. 4 is that all of the sense-amplifier-circuitry is provided under the memory arrays 18 and 22, which may enable tight packing of the memory arrays across a semiconductor substrate; or in other words, which may conserve valuable semiconductor real estate as compared to conventional configurations in which at least some of the sense-amplifier-circuitry is along a same elevational plane as a memory array. The vertical stacking of the memory arrays 18 and 22 may further conserve valuable semiconductor real estate.

Figure 5:
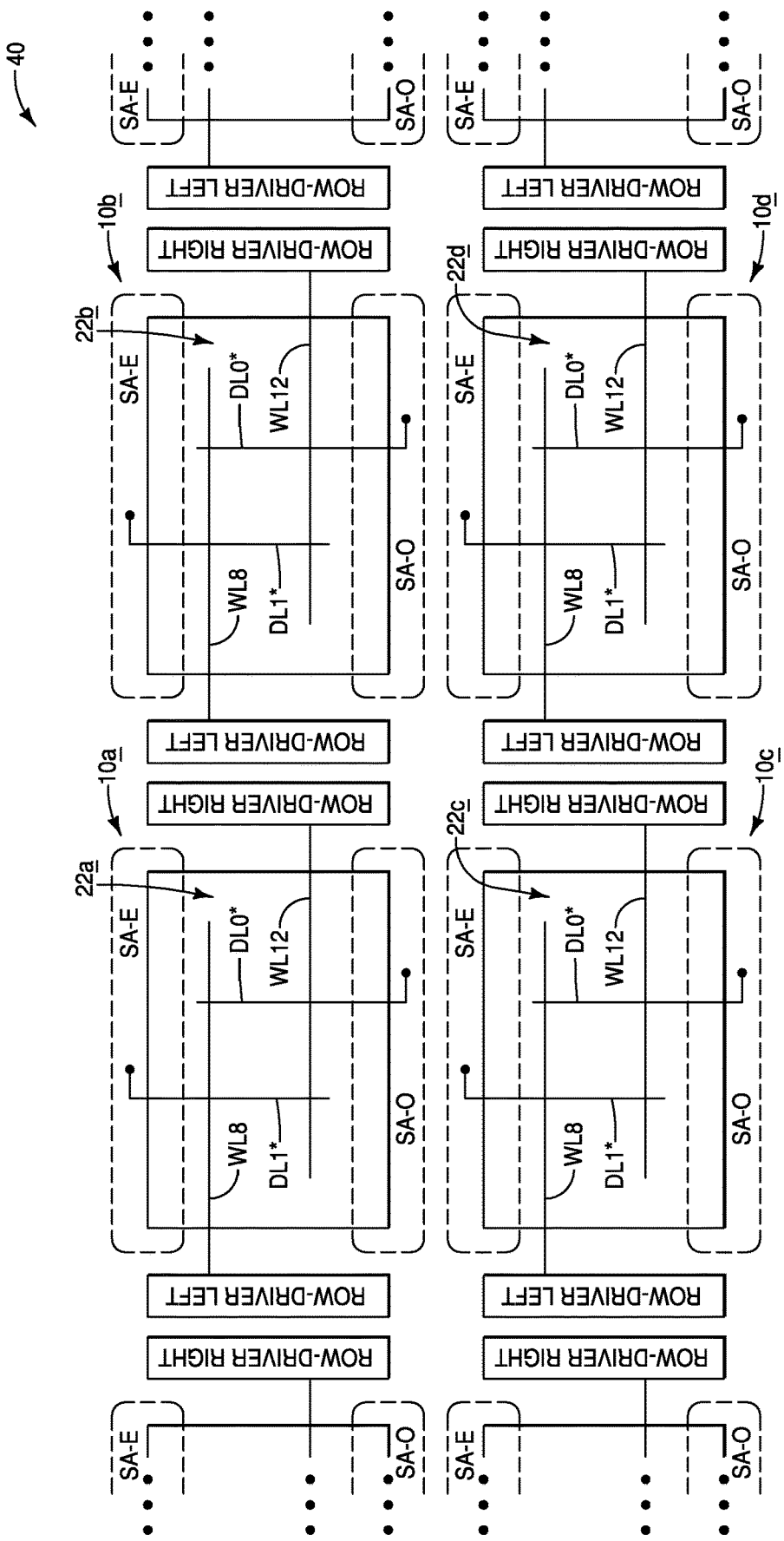
FIG. 5 is diagrammatic top-down view of a layout of an example arrangement of memory arrays and associated circuitry.

In some embodiments, the configuration of FIG. 4 may be representative of multiple configurations which are laterally displaced relative to one another across a semiconductor die. For instance, FIG. 5 shows a top-down view of a region of an example die 40 having multiple memory arrays 22 (labeled as a raise 22a-d) laterally displaced relative to one another. Such memory arrays are illustrated to be associated with configurations 10a-d, with such configurations being analogous to the configuration 10 of FIG. 4.

The memory arrays 18 and 22 of FIG. 4 may comprise any suitable memory cells. Example configurations of such memory arrays are described with reference to FIGS. 6A, 6B, 7A, 7B, 8A and 8B; with FIGS. 6A, 7A and 8A being along the line A-A of FIG. 4, and FIGS. 6B, 7B and 8B being along the line B-B of FIG. 4.

Figure 6B:
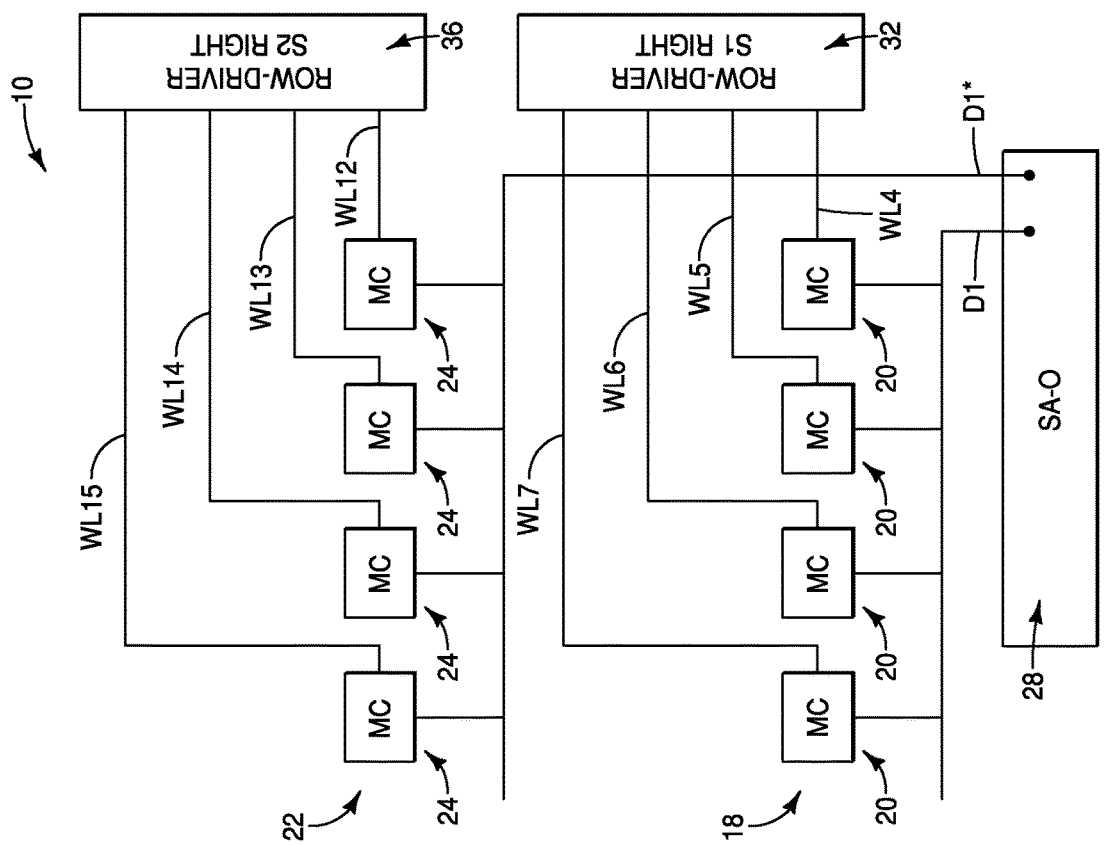
FIGS. 6A and 6B are diagrammatic side views along the lines A-A and B-B, respectively, of FIG. 4 showing example arrangements of circuit components.
Figure 6A:
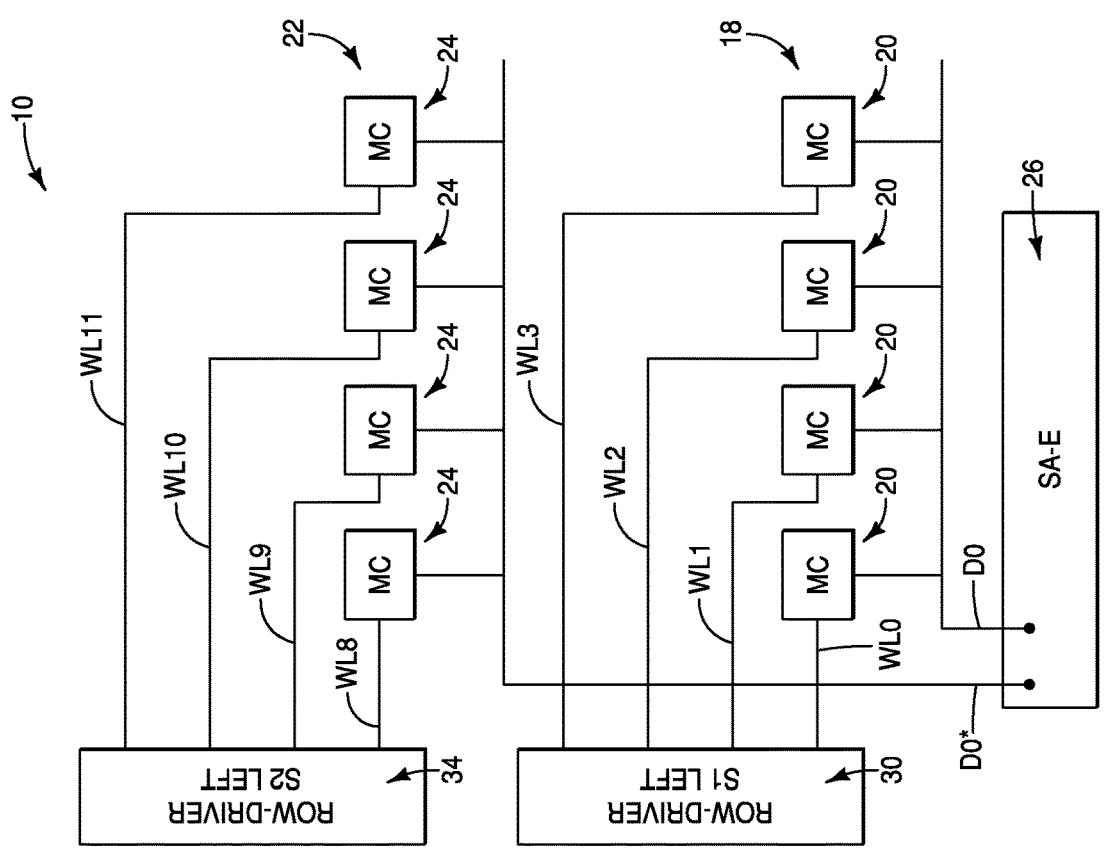

Referring to FIGS. 6A and 6B, the memory cells 20 and 24 of the memory arrays 18 and 20 are labeled as MC. Each of the memory cells 20 of the memory array 18 is uniquely addressed by a digit line (D0 or D1) and a wordline (WL0-WL7). Each of the memory cells 24 of the memory array 22 is uniquely addressed by a digit line (D0* or D1*) and a wordline (WL8-WL15). The digit lines D0 and D0* are comparatively coupled to one another through the sense-amplifier-circuitry 26, and the digit lines D1 and D1* are comparatively coupled to one another through the sense-amplifier-circuitry 28.

In some embodiments, the wordlines WL0-WL7 may be considered to be the first set of wordlines associated with the first memory array 18; with the wordlines WL0-WL3 being considered to be even wordlines coupled with the row-driver 30, and the wordlines WL4-WL7 being considered to be odd wordlines coupled with the row-driver 32. Similarly, the wordlines WL8-WL15 may be considered the second set of wordlines associated with the second memory array 22; with the wordlines WL8-WL11 being considered to be even wordlines coupled with the row-driver 34, and the wordlines WL12-WL15 being considered to be odd wordlines coupled with the row-driver 36.

Referring to FIGS. 7A and 7B, the example memory cells 20 and 24 of the memory arrays 18 and 20 are shown in more detail than in FIGS. 6A and 6B. Each of the example memory cells 20 and 24 includes a transistor T coupled with a capacitor C. Each capacitor has a node coupled with a reference voltage 42. The reference voltage 42 may correspond to the common plate (CP) voltage described above with reference to FIG. 1. The illustrated memory cells of FIGS. 7A and 7B are 1T-1C memory cells. In other embodiments, other memory cells may be utilized. The capacitors of the illustrated memory cells 20 and 24 are example charge-storage devices, and in other embodiments other suitable charge-storage devices (e.g., phase-change devices, conductive-bridging devices, etc.) may be utilized.

Referring to FIGS. 8A and 8B, the example memory cells 20 and 24 of the memory arrays 18 and 20 are shown in more detail than in FIGS. 7A and 7B. The transistors T are shown to comprise vertically-extending pillars 50 of semiconductor material 52. The semiconductor material 52 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). Source/drain and channel regions (not shown) may be provided within the pillars 50. Gate dielectric material 54 is along sidewalls of the pillars, and conductive gate material 56 is along the gate dielectric material.

The gate dielectric material 54 may comprise any suitable composition(s); and in some embodiments may comprise, consist essentially of, or consist of silicon dioxide.

The gate material 56 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The capacitors C comprise first conductive nodes 58, second conductive nodes 60, and insulative material 62 between the first and second conductive nodes. The first and second conductive nodes 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another. The insulative material 62 may comprise any suitable composition(s), and in some embodiments may comprise, consist essentially of, or consist of silicon dioxide.

In the shown embodiment, the lower conductive nodes 58 are configured as upwardly-opening containers. In other embodiments, the lower conductive nodes may have other suitable shapes. The lower conductive nodes 58 may be referred to as storage nodes, and the upper nodes 60 may be referred to as plate electrodes. In some embodiments, the plate electrodes within memory array 18 may all be coupled to one another, and the plate electrodes within memory array 22 may also all be coupled to one another.

The digit lines D0, D0*, D1 and D1* are shown to comprise conductive materials 64, 66, 68 and 70, respectively. Such conductive materials may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The conductive materials 64, 66, 68 and 70 may be the same composition as one another in some embodiments, or at least one of the conductive materials may differ from another in other embodiments.

The sense-amplifier-circuitries 26 and 28 may comprise any suitable configurations. An example sense-amplifier-circuitry 26 is diagrammatically illustrated in FIG. 9. A dashed line 71 is provided to show an approximate boundary of the sense-amplifier-circuitry. Although the illustrated circuitry is described as being sense-amplifier-circuitry 26, it is to be understood that the sense-amplifier-circuitry 28 may comprise an identical configuration as that describe relative to the example configuration of FIG. 9.

The sense-amplifier-circuitry of FIG. 9 includes a p-sense amplifier 80 comprising a pair of cross-coupled pull-up transistors 82 and 84, and includes an n-sense amplifier 86 comprising a pair of cross-coupled pull-down transistors 88 and 90. The p-sense amplifier 80 is coupled with active pull-up circuitry (labeled ACT), and the n-sense amplifier 86 is coupled with a common node (labeled RNL). The illustrated sense-amplifier-circuitry 26 is coupled with the digit lines D0 and D0*; or in other words the digit lines D0 and D0* are comparatively coupled with one another through the illustrated sense-amplifier-circuitry 26. In operation the amplifiers 80 and 86 may be utilized together to detect the relative signal voltages of D0 and D0*, and to drive the higher signal voltage to VCC while driving the lower signal voltage to ground. Also, inputs and outputs associated with the sense amplifier (labeled as I/O) may be utilized for exporting data regarding the relative signal voltages of D0 and D0*, and/or for programming memory cells along one or both of D0 and D0*.

The illustrated sense-amplifier-circuitry also has equilibration circuitry (labeled EQ) provided therein to balance electrical properties within the sense amplifier. Other circuitry (not shown) may also be provided within the sense-amplifier-circuitry. The sense-amplifier-circuitry of FIG. 9 may comprise any suitable configuration, and in some embodiments may comprise conventional configurations.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a base with sense-amplifier-circuitry. A first deck is over the base, and includes a first array of first memory cells. A second deck over the first deck, and includes a second array of second memory cells. A first digit line is associated with the first array, and a second digit line is associated with the second array. The first and second digit lines are comparatively coupled with one another through the sense-amplifier-circuitry.

Some embodiments include an integrated assembly having a base which comprises a first sense-amplifier-circuitry and a second sense-amplifier-circuitry. The second sense-amplifier-circuitry is laterally displaced from the first sense-amplifier-circuitry. A first deck is over the base and comprises a first array of first memory cells. A second deck is over the first deck and comprises a second array of second memory cells. First digit lines are associated with the first array. The first digit lines alternate between even first digit lines and odd first digit lines. Second digit lines are associated with the second array. The second digit lines alternate between even second digit lines and odd second digit lines. Individual of the even first digit lines are comparatively coupled with individual of the even second digit lines through the first sense-amplifier-circuitry. Individual of the odd first digit lines are comparatively coupled with individual of the odd second digit lines through the second sense-amplifier-circuitry.

Some embodiments include an integrated assembly which includes a first sense-amplifier-circuitry laterally displaced relative to a second sense-amplifier-circuitry. First digit lines are vertically displaced relative to the first and second sense-amplifier-circuitries and extend along a first memory array. The first digit lines are laterally displaced relative to one another and alternate between even first digit lines and odd first digit lines. Second digit lines are vertically displaced relative to the first and second sense-amplifier-circuitries, vertically displaced relative the first digit lines, and extend along a second memory array. The second digit lines are laterally displaced relative to one another and alternate between even second digit lines and odd second digit lines. Individual of the even first digit lines are comparatively coupled with individual of the even second digit lines through the first sense-amplifier-circuitry. Individual of the odd first digit lines are comparatively coupled with individual of the odd second digit lines through the second sense-amplifier-circuitry. A first set of first wordlines extends along the first memory array. A second set of second wordlines extends along the second memory array. The first wordlines are coupled with first wordline-driver-circuitry. The second wordlines are coupled with second wordline-driver-circuitry.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a base comprising sense-amplifier-circuitry;
a first deck over the base and comprising a first array of first memory cells;
a second deck over the first deck and comprising a second array of second memory cells;
a first digit line associated with the first array;
a second digit line associated with the second array; and
the first and second digit lines being comparatively coupled with one another through the sense-amplifier-circuitry.

2. The integrated assembly of claim 1 wherein:
the first digit line is one of many digit lines of a first set of digit lines utilized to address the first memory cells;
a first set of wordlines is also utilized to address the first memory cells;
each of the first memory cells is uniquely addressed by one of the digit lines of the first set of digit lines and one of the wordlines of the first set of wordlines;
the second digit line is one of many digit lines of a second set of digit lines utilized to address the second memory cells;
a second set of wordlines is also utilized to address the second memory cells; and
each of the second memory cells is uniquely addressed by one of the digit lines of the second set of digit lines and one of the wordlines of the second set of wordlines.

3. The integrated assembly of claim 2 wherein:
the wordlines of the first set of wordlines are coupled with first wordline-driver-circuitry which is associated only with the wordlines of the first set of wordlines; and
the wordlines of the second set of wordlines are coupled with second wordline-driver-circuitry which is associated only with the wordlines of the second set of wordlines.

4. The integrated assembly of claim 3 wherein:
the wordlines of the first set are first wordlines;
the wordlines of the second set are second wordlines;
the first wordline-driver-circuitry comprises a first component along a first side of the first array, and comprises a second component along a second side of the first array;
the first set of first wordlines comprises alternating even and odd first wordlines;
the first component is coupled with the even first wordlines; and
the second component is coupled with the odd first wordlines.

5. The integrated assembly of claim 4 wherein:
the second wordline-driver-circuitry comprises a third component along a first side of the second array, and comprises a fourth component along a second side of the second array;
the second set of second wordlines comprises alternating even and odd second wordlines;
the third component is coupled with the even second wordlines; and
the fourth component is coupled with the odd second wordlines.

6. An integrated assembly, comprising:
a base comprising a first sense-amplifier-circuitry and a second sense-amplifier-circuitry, with the second sense-amplifier-circuitry being laterally displaced from the first sense-amplifier-circuitry;
a first deck over the base and comprising a first array of first memory cells;
a second deck over the first deck and comprising a second array of second memory cells;
first digit lines associated with the first array, the first digit lines alternating between even first digit lines and odd first digit lines;
second digit lines associated with the second array, the second digit lines alternating between even second digit lines and odd second digit lines;
individual of the even first digit lines being comparatively coupled with individual of the even second digit lines through the first sense-amplifier-circuitry; and
individual of the odd first digit lines being comparatively coupled with individual of the odd second digit lines through the second sense-amplifier-circuitry.

7. The integrated assembly of claim 6 wherein:
the first digit lines are utilized to address the first memory cells;
a first set of first wordlines is also utilized to address the first memory cells;
each of the first memory cells is uniquely addressed by one of the first digit and one of the first wordlines;
the second digit lines are utilized to address the second memory cells;
a second set of second wordlines is also utilized to address the second memory cells; and
each of the second memory cells is uniquely addressed by one of the second digit lines and one of the second wordlines.

8. The integrated assembly of claim 7 wherein:
the wordlines of the first set of wordlines are coupled with first wordline-driver-circuitry which is associated only with the wordlines of the first set of wordlines; and
the wordlines of the second set of wordlines are coupled with second wordline-driver-circuitry which is associated only with the wordlines of the second set of wordlines.

9. The integrated assembly of claim 8 wherein:
the first wordline-driver-circuitry comprises a first component along a first side of the first array, and comprises a second component along a second side of the first array;
the first set of first wordlines comprises alternating even and odd first wordlines;
the first component is coupled with the even first wordlines;
the second component is coupled with the odd first wordlines;
the second wordline-driver-circuitry comprises a third component along a first side of the second array, and comprises a fourth component along a second side of the second array;
the second set of second wordlines comprises alternating even and odd second wordlines;
the third component is coupled with the even second wordlines; and
the fourth component is coupled with the odd second wordlines.

10. The integrated assembly of claim 6 wherein each of the memory cells comprises a charge-storage device in combination with a transistor.

11. The integrated assembly of claim 6 wherein each of the memory cells comprises a capacitor in combination with a transistor.

12. An integrated assembly, comprising:
a first sense-amplifier-circuitry laterally displaced relative to a second sense-amplifier-circuitry;
first digit lines vertically displaced relative to the first and second sense-amplifier-circuitries and extending along a first memory array; the first digit lines being laterally displaced relative to one another and alternating between even first digit lines and odd first digit lines, each of the even first digit lines and the odd first digit lines having a first portion that extends vertically and a second portion that extends non-vertically along the first memory array;
second digit lines vertically displaced relative to the first and second sense-amplifier-circuitries, vertically displaced relative the first digit lines, and extending along a second memory array; the second digit lines being laterally displaced relative to one another and alternating between even second digit lines and odd second digit lines, each of the even second digit lines and the odd second digit lines having a first portion that extends vertically and a second portion that extends non-vertically along the second memory array;
individual of the even first digit lines being comparatively coupled with individual of the even second digit lines through the first sense-amplifier-circuitry;
individual of the odd first digit lines being comparatively coupled with individual of the odd second digit lines through the second sense-amplifier-circuitry;
a first set of first wordlines extending along the first memory array;
a second set of second wordlines extending along the second memory array;
the first wordlines being coupled with first wordline-driver-circuitry; and
the second wordlines being coupled with second wordline-driver-circuitry.

13. The integrated assembly of claim 12 wherein the first and second wordline-driver-circuitries are above the first and second sense-amplifier-circuitries.

14. The integrated assembly of claim 12 wherein:
the first wordline-driver-circuitry comprises a first component along a first side of the first memory array, and comprises a second component along a second side of the first memory array;
the first set of first wordlines comprises alternating even and odd first wordlines;
the first component is coupled with the even first wordlines;
the second component is coupled with the odd first wordlines;
the second wordline-driver-circuitry comprises a third component along a first side of the second memory array, and comprises a fourth component along a second side of the second memory array;
the second set of second wordlines comprises alternating even and odd second wordlines;
the third component is coupled with the even second wordlines; and
the fourth component is coupled with the odd second wordlines.

* * * * *